(12) United States Patent
Lane

(10) Patent No.: US 6,979,849 B2
(45) Date of Patent: Dec. 27, 2005

(54) MEMORY CELL HAVING IMPROVED INTERCONNECT

(75) Inventor: Richard Lane, Boise, ID (US)

(73) Assignee: Micron Technology, Inc., Boise, ID (US)

(*) Notice: Subject to any disclaimer, the term of this patent is extended or adjusted under 35 U.S.C. 154(b) by 14 days.

(21) Appl. No.: 10/750,737

(22) Filed: Dec. 31, 2003

(65) Prior Publication Data

US 2005/0139884 A1  Jun. 30, 2005

(51) Int. Cl.[7] ............... H01L 27/108; H01L 29/76; H01L 29/94; H01L 31/119
(52) U.S. Cl. .......... 257/296; 257/297; 257/298; 257/300; 257/306; 257/311; 257/906
(58) Field of Search ............ 257/296–298, 257/300, 306, 311, 906

(56) References Cited

U.S. PATENT DOCUMENTS

| | | | | |
|---|---|---|---|---|
| 4,903,110 A | * | 2/1990 | Aono | 361/313 |
| 6,011,284 A | * | 1/2000 | Katori et al. | 257/295 |
| 6,207,987 B1 | * | 3/2001 | Tottori | 257/306 |
| 6,607,980 B2 | * | 8/2003 | Uchiyama et al. | 438/660 |
| 6,730,950 B1 | * | 5/2004 | Seshadri et al. | 257/295 |
| 6,743,643 B2 | * | 6/2004 | Joshi et al. | 438/3 |
| 6,815,223 B2 | * | 11/2004 | Celinska et al. | 438/3 |
| 6,844,583 B2 | * | 1/2005 | Kim et al. | 257/306 |
| 6,858,443 B2 | * | 2/2005 | Lee et al. | 438/30 |
| 6,864,527 B2 | * | 3/2005 | DeBoer et al. | 257/303 |
| 2001/0022369 A1 | * | 9/2001 | Fukuda et al. | 257/207 |
| 2001/0045589 A1 | * | 11/2001 | Takeda et al. | 257/297 |
| 2002/0024073 A1 | * | 2/2002 | Shimada et al. | 257/295 |
| 2002/0028562 A1 | * | 3/2002 | Park | 438/396 |
| 2002/0089059 A1 | * | 7/2002 | Imai | 257/758 |
| 2002/0135005 A1 | * | 9/2002 | Ma et al. | 257/296 |
| 2004/0129963 A1 | * | 7/2004 | Amo et al. | 257/296 |
| 2004/0150019 A1 | * | 8/2004 | Nakashima et al. | 257/296 |

* cited by examiner

Primary Examiner—Michael Trinh
Assistant Examiner—Ida M. Soward
(74) Attorney, Agent, or Firm—Fletcher Yoder

(57) ABSTRACT

A memory cell having improved interconnect. Specifically, a dynamic random access memory (DRAM) based content addressable (CAM) memory cell is provided. The lower cell plate of the storage capacitor is implemented to provide an interconnect for the access transistor and the CAM portion of the memory cell. Conductive plugs are coupled to each of the transistors and coupled directly to the lower cell plate of the capacitor.

26 Claims, 4 Drawing Sheets

MEMORY CELL HAVING IMPROVED INTERCONNECT

BACKGROUND OF THE INVENTION

1. Field of the Invention

The present invention relates generally to a technique for fabricating integrated circuits and, more particularly, to a technique for fabricating content addressable memory devices.

2. Background of the Related Art

This section is intended to introduce the reader to various aspects of art, which may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled circuits are used in a wide variety of applications. Such applications include personal computers, control systems, telephone networks, and a host of other consumer products. A personal computer or control system includes various components, such as microprocessors, that handle different functions for the system. By combining these components, various consumer products and systems may be designed to meet specific needs. Microprocessors are essentially generic devices that perform specific functions under the control of software programs. These software programs are generally stored in one or more memory devices that are coupled to the microprocessor and/or other peripherals.

The memory devices include many different types of circuits that are typically formed using conductive, semiconductive and insulative materials. These circuits work together to allow the memory device to carry out and control various functions within an electronic device. One type of high-density memory device is a random access memory (RAM) device. Random access memory devices are complex integrated circuits which are fabricated using a variety of designs and fabrication techniques. Despite their complexity, manufacturers typically attempt to design memory devices that are inexpensive to manufacture, yet maintain high performance and reliability.

Random access memory devices, such as dynamic random access memory (DRAM) devices and static random access memory (SRAM) devices generally include a number of memory cells arranged in an array of rows and columns. The rows and columns provide signal paths to and from each memory cell in the array. Regardless of whether the device is a DRAM or SRAM, each memory cell generally includes one or more storage devices, such as capacitors, and one or more access devices, such as transistors. The access devices are generally coupled to the rows and columns of the array to provide access to the storage device. As can be appreciated, the rows and columns may also be referred to as wordlines and bitlines.

Another type of storage device that may be implemented in a system is a content addressable memory (CAM) memory device. A CAM memory device is a type of storage device which includes comparison logic in each memory cell, along the access and storage elements. CAM devices are designed to enhance data retrieval speed from a particular location in the memory array. Instead of using an address to read the data, as in a typical RAM device, the data is provided to locate the address in a look-up table for instance. The CAM device that is coupled to the storage portion of the memory cell is implemented to determine whether data is found within the particular cell of the memory array. When a match is found, the CAM device outputs the address location in the array. By sending a data value to each memory cell of the memory array and comparing it with the data stored therein, accelerated data searches may be performed in the memory array.

As can be appreciated, because DRAM-based CAM devices include a device to facilitate the data comparison, along with an access device and storage device, structural limitations resulting from high density fabrication techniques may provide designers with a greater challenge than with standard RAM devices. Reducing cell size without compromising device functionality provides DRAM-based CAM designers with a number of challenges.

BRIEF DESCRIPTION OF THE DRAWINGS

Advantages of the invention may become apparent upon reading the following detailed description and upon reference to the drawings in which.

DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
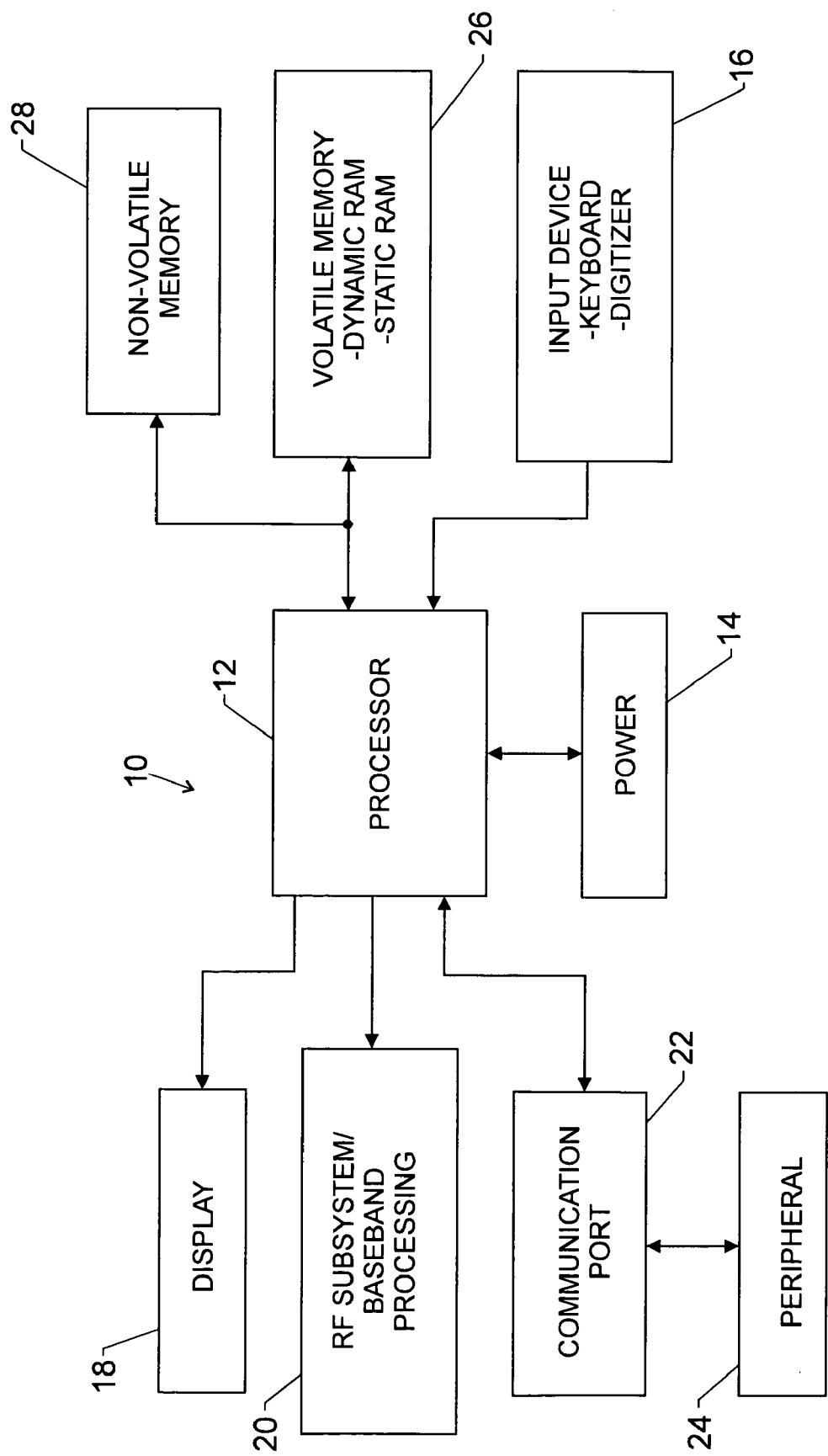
FIG. 1 illustrates a block diagram of an exemplary processor-based device.

Turning now to the drawings, and referring initially to FIG. 1, a block diagram depicting an exemplary processor-based system, generally designated by reference numeral 10, is illustrated. The system 10 may be any of a variety of types such as a computer, pager, cellular phone, personal organizer, control circuit, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance.

The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example.

Furthermore, an RF sub-system/baseband processor 20 may also be couple to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, memory is used to enable the processor 12 to be efficient. Generally, the memory is coupled to the processor 12 to store and facilitate execution of various programs. For instance, the processor 12 may be coupled to the volatile memory 26 which may include Dynamic Random Access Memory (DRAM), Static Random Access Memory (SRAM) or a RAM-based CAM device. The processor 12 may also be coupled to non-volatile memory 28. The non-volatile memory 28 may include a read-only memory (ROM), such as an EPROM, and/or flash memory to be used in conjunction with the volatile memory. The size of the ROM is typically selected to be just large enough to store any necessary operating system, application programs, and fixed data. The volatile memory 26 on the other hand, is typically quite large so that it can store dynamically loaded applications and data. Additionally, the non-volatile memory 28 may include a high capacity memory such as a tape or disk drive memory.

Figure 2:
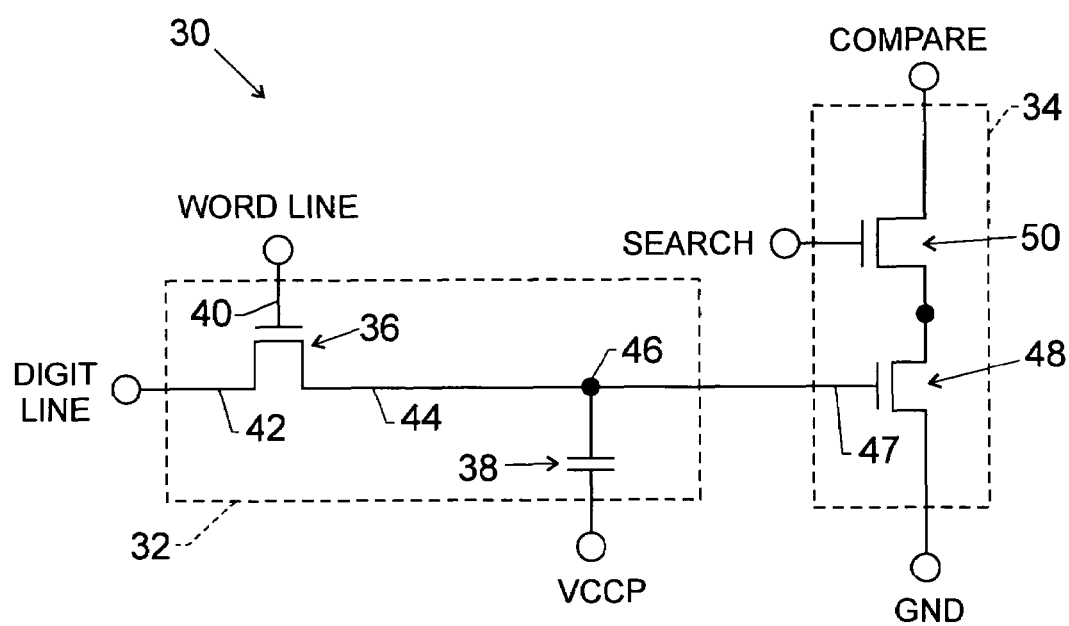
FIG. 2 illustrates a schematic diagram of an exemplary DRAM-based CAM device that may be fabricated in accordance with the present techniques.

In accordance with the present embodiment, the volatile memory 26 may include a number of DRAM based CAM memory cells such as the memory cell 30 illustrated in FIG. 2. The memory cell 30 includes a DRAM portion 32 and a CAM portion 34. The DRAM portion 32 includes an access device such as a transistor 36 and a storage device, such as a capacitor 38. The transistor 36 may be a metal-oxide-semiconductor field affect transistor (MOSFET), complimentary metal-oxide-semiconductor transistor (CMOS), or any other suitable transistor. Further, the transistor 36 may be an n-channel or a p-channel transistor, depending on the specific design.

As will be appreciated, the gate 40 of the transistor 36 may be coupled to the wordline of a memory array and the drain 42 is coupled to the digit line of a memory array. The source 44 of the transistor 36 is coupled to one terminal of the capacitor 38 at a storage node 46. The other terminal of the capacitor 38 may be coupled to a voltage source $V_{CCP}$ having a higher voltage potential than that of the storage node 46. The higher potential voltage source $V_{CCP}$ may be 1.4 volts above $V_{CC}$, for instance.

The DRAM portion 32 of the CAM memory cell 30 is also couple to the CAM portion 34 at the storage node 46. The CAM portion 34 is configured to detect the presence of particular data stored in the capacitor 38 by comparing data received at the CAM portion 34 to data stored in the capacitor 38. More specifically, the storage node 46 of the DRAM portion 32 is coupled to the gate 47 of a transistor 48 which is used to sense the presence of data stored in the DRAM capacitor 38. One terminal of the transistor 48 is coupled to ground and the other terminal of the transistor 48 is coupled to a transistor 50. The transistors 48 and 50 may be MOSFETs, CMOS transistors, or any other suitable type. Further, the transistors 48 and 50 may be n-channel or p-channel transistors. As will be appreciated, the CAM portion 34 of the memory cell 30 is configured to match data to a particular location. Accordingly, during a memory cycle, the transistor 50 receives a data word and compares the data word to the data word in the capacitor 38. If the particular memory cell 30 contains the data being requested a "match" is detected.

Figure 3:
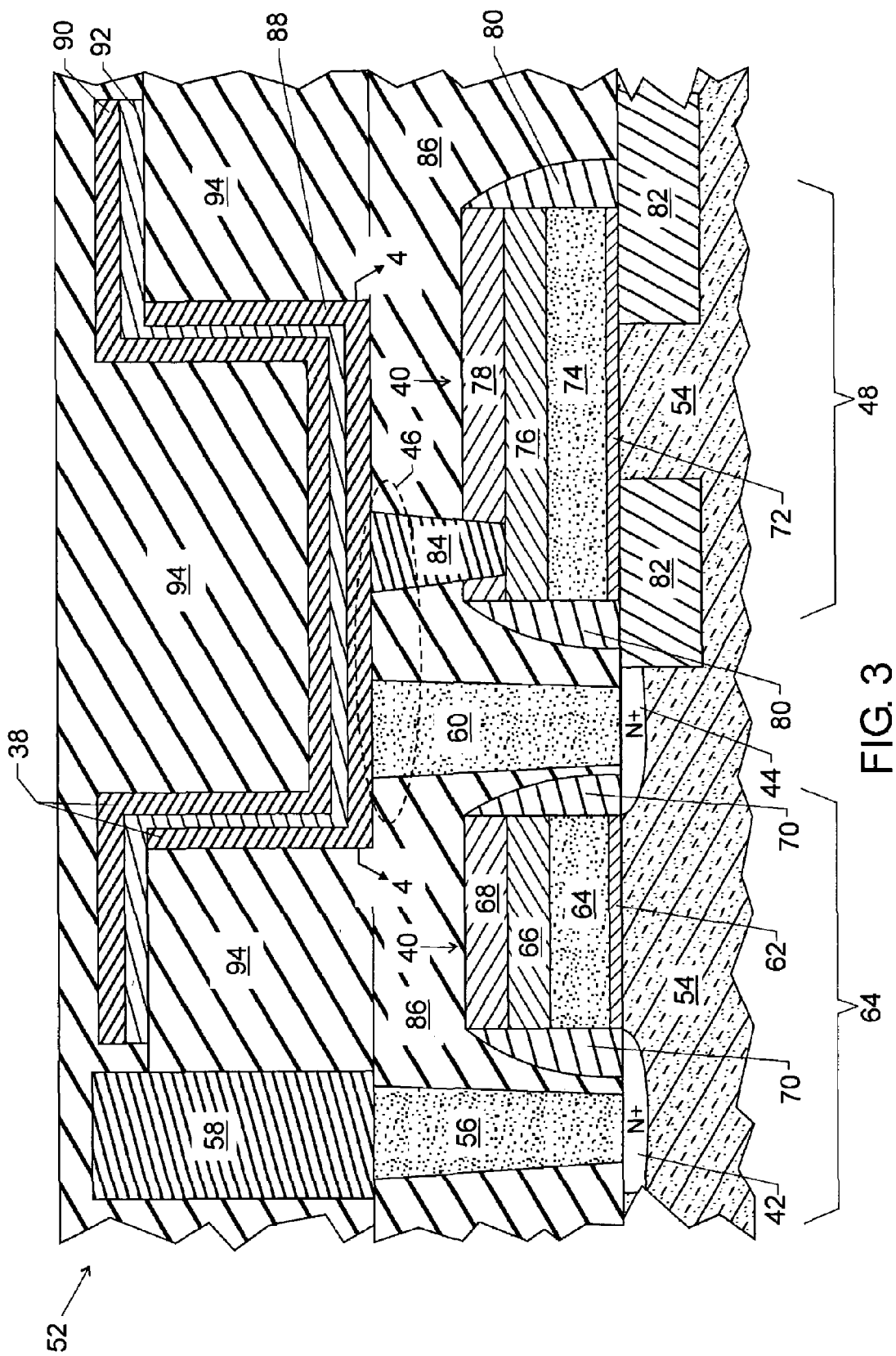
FIG. 3 illustrates a partial cross-sectional view of a DRAM-based CAM device in accordance with the present techniques.

In fabricating a CAM memory cell 30, each of the transistor 36, transistor 48 and capacitor 38 are coupled together at the storage node 46, as illustrated in FIG. 2. Based on limited chip space and limitations on aspect ratios and manufacturability, constructing an interconnect at the storage node 46 can be challenging. FIG. 3 illustrates a structure in accordance with exemplary embodiments of the present techniques for providing an interconnect at the storage node 46 for the transistor 36, transistor 48 and capacitor 38 at the storage node 46.

The memory cell 30 may be fabricated on a substrate by implementing a number of manufacturing processes, such as layering, doping, patterning and heat treatments. Briefly, layering generally refers to adding material to the surface of a substrate by a growth process such as oxidation, or through a deposition process, such as chemical vapor deposition (CVD) or a physical vapor deposition (PVD). Doping generally refers to the process of implanting dopants into the substrate surface or overlying layers and may be used to increase the current carrying capacity of a region of the wafer or overlying layer of material. The doping process may be implemented before a layer is formed, between layers, or even after the layer is formed. Generally, the doping the process may be accomplished through an ion implantation process using boron or other similar dopants, or through a thermal diffusion process, for example.

Patterning generally refers to a series of steps that result in the removal of selected portions of layers or underlying substrate material. After removal of the selected portions of the layers via a wet or dry etch process, a pattern is left in the structure. The removal of material allows the structure of the device to be formed by providing holes or windows between layers or by removing unwanted layers. Patterning sets the critical dimensions of the integrated circuit structures being fabricated. Those having ordinary skill in the art will appreciate the many manufacturing steps involved in fabricating the structure illustrated in FIG. 3. Accordingly, the particular process flow that may be implemented to fabricate the structure illustrated in FIG. 3 may vary and is not described in detail, herein.

FIG. 3 is a cross-sectional view of the storage node 46 and surrounding structures in accordance with embodiments of the present invention. The structure is generally illustrated by the reference numeral 52. Generally, the structure 52 utilizes the lower metal cell plate of the capacitor 38 as the storage node 46 to couple the gate of the transistor 48 in the CAM portion 34 of the memory cell 30 to the source 44 of the transistor 36 in the DRAM portion 32 of the memory cell 30. Advantageously, the structure 52 allows for a compact array layout without disturbing the critical structures of the storage node 46.

The structure 52 will be recognized by those skilled in the art as illustrating a cross-section of the access transistor 36, the storage capacitor 38 and the transistor 48. As previously described, the memory cell 30 may be fabricated on a substrate 54 such as a p-type silicon substrate. Referring initially to the structure of the transistor 36, the substrate 54 includes doped/active regions formed by a suitable doping technique such as ion implantation. The doped regions form the drain 42 and source 44 of the access transistor 36. To couple the drain 42 to the digit line of the memory array, a conductive post 56, such as a polysilicon post, may be implemented. The post 56 is further coupled to a conductive material 58, such as tungsten (W), which may form the digit line of the memory array. Similarly, to facilitate the coupling of the source 44 of the transistor 36 to the storage node 46, a conductive post 60, such as a polysilicon post may be implemented.

The gate 40 is fabricated to form the wordline of the memory array. As will be appreciated by those skilled in the art, the gate 40 generally includes a gate oxide layer 62 disposed on the substrate 54 and configured to insulate the channel for the access transistor 36. A conductive polysilicon layer 64 is disposed on the gate oxide layer 62 and patterned in accordance with the dimensions of the underlying channel. To provide improved contact to the polysilicon layer 64 in the wordline, one or more conductive layers 66, such as tungsten and tungsten silicide, may be disposed and patterned over the polysilicon layer 64. Finally, a cap 68 may be disposed on the conductive layer 66 to project the underlying materials from damage during fabrication of the structure 52. The cap 68 may include one or more dielectric materials such as nitride or tetra ethyl oxysilane (TEOS). Similarly, to further protect the edges of the wordline structure during processing, spacers 70 comprising one or more dielectric materials such as nitride, may be fabricated. As previously discussed, those skilled in the art will appreciate the various techniques and materials implemented to form the transistor 36.

Referring now to the transistor 48, the gate 47 may be fabricated in conjunction with the gate 40 of the transistor 36 and may include the same materials. Accordingly, the gate 47 includes a gate oxide layer 72, a polysilicon layer 74, a conductive layer 76, a dielectric cap 78 and dielectric spacers 80. Because the formation of the source and drain of the transistor 48 are not pertinent to the present embodiments, these structures are not illustrated. However, one skilled in the art will be aware that these structures are formed along the gate 47 at a point further down the z-axis (i.e., into the page). In the present view, to isolate the drain/source of the transistor 48 from the source 44 of the transistor 36, a dielectric material 82 is disposed within shallow trenches etched in the substrate 54. Once the shallow trenches are etched in the substrate 54, a dielectric material such as an oxide 82 may be disposed therein. As will be appreciated, the drain and source of the transistor 48 are formed behind the presently illustrated oxide regions 82. Finally, to couple the gate 47 of the transistor 48 to the access node 46, a conductive post 84, such as a tungsten post, may be formed. As will be appreciated, during formation of the post opening, a punch process may be implemented to punch through the cap layer 78 to provide contact to the underlying conductive layer 76.

Each of the transistor 36 and transistor 48 may be formed through a number of layering, patterning, doping and anneal processes, as previously described. Once the transistors 36 and 48 are fabricated, a dielectric layer 86, such as a phosphosilicate glass (PSG) layer is disposed to bury the transistors 36 and 48. It should be noted that the posts 56, 60 and 84 are generally formed after deposition of the dielectric layer 86. Thus, after planarizing the dielectric layer 86, the contacts to the various nodes of the transistors (i.e., post 56, post 60 and post 84) may be formed by etching and/or punching through the various dielectric layer to provide conductive contact to the terminals of the transistors 36 and 48.

After forming the contacts by disposing conductive material in the punched regions to form the posts 56, 60 and 84, the capacitor 38 may be fabricated. In accordance with the present exemplary embodiments, a container type storage capacitor 38 is implemented and the lower metal cell plate 88 of the capacitor 38 is couple directly to the conductive posts 60 and 64. By increasing the dimension of the lower cell plate 88 of the capacitor 38, no additional contacts need to be formed and the critical structures of the underlying materials may be preserved. The lower cell plate 88 of the capacitor 38 may comprise titanium nitride, for instance. Similarly, the upper cell plate 90 of the capacitor 38 may comprise a titanium nitride material. The upper and lower cell plates 90 and 88 are separated by a dielectric layer such as an aluminum oxide ($Al_2O_3$) 92. As with the underlying structures, the capacitor 38 is surrounded by a dielectric layer 94 which may include one or more dielectric materials such as phosphosilicate glass (PSG).

As will be appreciated, by implementing the lower cell plate 88 of the storage capacitor 38 to provide the storage node 46 of the memory cell 30, the junction leakage at the source 44 is not increased and the charge retention within the storage capacitor 38 is not reduced. As will be further illustrated with reference to FIG. 4, the present embodiment advantageously increases the capacitive area by increasing the size of the lower cell plate 88. Further, by using different materials to form the post 60 of the transistor 36 and the post 84 of the transistor 48, contact resistance may be increased while minimizing leakage potential. Further, the formation of the posts 60 and 84 may be performed at different steps in the fabrication, thereby reducing potential fabrication difficulties. As will be appreciated, by using a polysilicon material to form the posts 56 and 60 to contact the source and drain of the transistor, leakage through the active regions of the drains 42 and source 44 in the silicon substrate 54 may be reduced.

Figure 4:
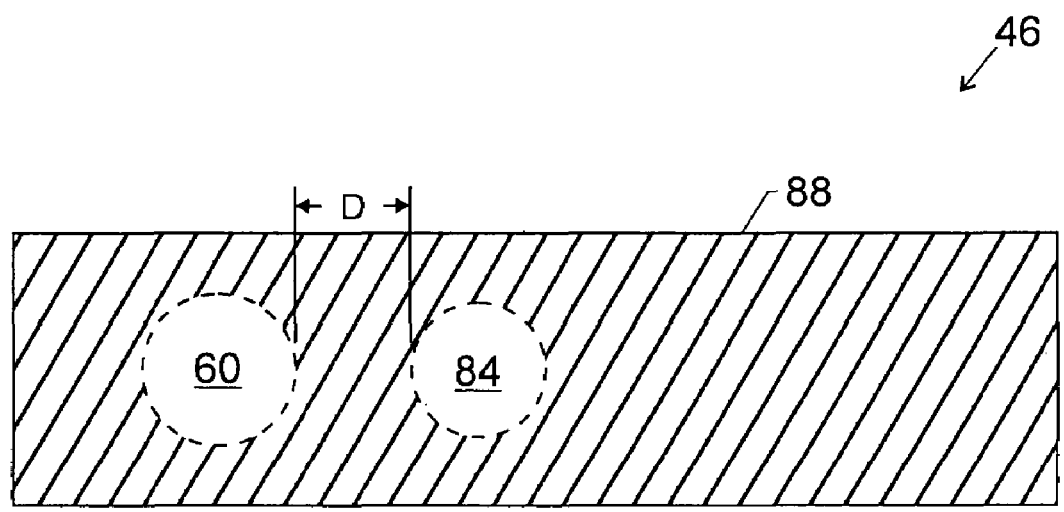
FIG. 4 illustrates a partial cut-away top view of the interconnect node of a DRAM-based CAM device fabricated in accordance with the present techniques.

Referring now to FIG. 4, a cut away top view of the lower cell plate 88 and underlying posts 60 and 84 is shown to illustrate the increased size of the lower cell plate 88. As will be appreciated, the increased cell plate provides and increased capacitive area. The surface area of the lower cell plate 88 is generally greater than the surface area of the cell plate in conventional devices because the lower cell plate 88 may be extended over the transistors 36 and 48 such that the corresponding posts 60 and 84 may be coupled directly thereto. For instance, if a 100 nm technology is implemented to fabricate the memory cell 30, the lower cell plate 88 may have an area of 100 nm by 300 nm. By implementing the present embodiments, the lower cell plate 88 is integrated as the interconnect between the capacitor 38 and the gate 47 to form the storage node 46. Advantageously, the present embodiments merge the interconnect function with the storage function of the capacitor 38.

Due to the increased size of the lower cell plate 88 and the implementation of different materials (and therefore different fabrication steps) for the posts 60 and 84, there is added flexibility in the placement of the posts 60 and 84 with respect to one another. In one exemplary embodiment, it may be advantageous to fabricate the posts 60 and 84 such that they are separated by a reduced distance D. As will be appreciated, the distance D will vary depending on the fabrication technology implemented. For instance, in a 100 nm process, the distance D may be on the order of approximately 50 nm. For a 50 nm process, the distance D may be on the order of approximately 20 nm. In another exemplary embodiment, it may be advantageous to increase the distance D. Because of the increased size of the lower cell plate 88, the posts 60 an 84 the distance D can be increased.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory device comprising:
   a capacitor having an upper cell plate and a lower cell plate;
   an access transistor coupled directly to the lower cell plate of the capacitor through a first conductive plug; and
   a transistor, wherein the gate of the transistor is coupled directly to the lower cell plate of the capacitor through a second conductive plug, and wherein the closest outer edge of the first conductive plug is separated from the closest outer edge of the second conductive plug by a distance in the range of approximately 20 nm to 50 nm.

2. The memory device, as set forth in claim 1, wherein the memory device comprises a content addressable memory device.

3. The memory device, as set forth in claim 1, wherein the lower cell plate has a surface area of approximately 100 nm×300 nm.

4. The memory device, as set forth in claim 1, wherein the first conductive plug comprises a polysilicon plug.

5. The memory device, as set forth in claim 1, wherein the second conductive plug comprises a metal plug.

6. The memory device, as set forth in claim 1, wherein the second conductive plug comprises a tungsten plug.

7. A system comprising:
   a processor; and
   a memory device coupled to the processor and comprising:
      a capacitor having an upper cell plate and a lower cell plate;
      an access transistor coupled directly to the lower cell plate of the capacitor through a first conductive plug; and
      a transistor, wherein the gate of the transistor is coupled directly to the lower cell plate of the capacitor through a second conductive plug, wherein the closest outer edge of the first conductive plug is separated from the closest outer edge of the second conductive plug by a distance in the range of approximately 20 nm to 50 nm.

8. The system, as set forth in claim 7, wherein the memory device comprises a content addressable memory device.

9. The system, as set forth in claim 7, wherein the lower cell plate has a surface area of approximately 100 nm×300 nm.

10. The system, as set forth in claim 7, wherein the first conductive plug comprises a polysilicon plug.

11. The system, as set forth in claim 7, wherein the second conductive plug comprises a metal plug.

12. The system, as set forth in claim 7, wherein the second conductive plug comprises a tungsten plug.

13. A memory device comprising:
    a content addressable memory portion comprising a first transistor coupled to a second transistor; and
    a memory portion comprising an access transistor and a storage capacitor, wherein the storage capacitor comprises a first cell plate configured to form an access node of the memory device, wherein the source of the access transistor and the gate of the first transistor are coupled to the first cell plate of the storage capacitor, and, wherein the closest distance between the first conductive post and the second conductive post is less than or equal to approximately 50 nm at the first cell plate.

14. The memory device, as set forth in claim 13, wherein the lower first cell plate has a surface area of approximately 100 nm×300 nm.

15. The memory device, as set forth in claim 13, wherein the source of the access transistor is coupled to the first cell plate by a first conductive post, and wherein the gate of the first transistor is coupled to the first cell plate by a second conductive post.

16. The memory device, as set forth in claim 15, wherein each of the first conductive post and the second conductive post comprise different types of material.

17. The memory device, as set forth in claim 15, wherein the first conductive post comprises polysilicon.

18. The memory device, as set forth in claim 15, wherein the second conductive post comprises a metal.

19. The memory device, as set forth in claim 15, wherein the second conductive post comprises tungsten.

20. A system comprising:
    a processor; and
    a memory device couple to the processor and comprising:
       a content addressable memory portion comprising a first transistor coupled to a second transistor; and
       a memory portion comprising an access transistor and a storage capacitor, wherein the storage capacitor comprises a first cell plate configured to form an access node of the memory device, wherein the source of the access transistor and the gate of the first transistor are coupled to the first cell plate of the storage capacitor, and wherein the closest distance between the first conductive post and the second conductive post is less than or equal to approximately 50 nm at the first cell plate.

21. The system, as set forth in claim 20, wherein the lower first cell plate has a surface area of approximately 100 nm×300 nm.

22. The system, as set forth in claim 20, wherein the source of the access transistor is coupled to the first cell plate by a first conductive post, and wherein the gate of the first transistor is coupled to the first cell plate by a second conductive post.

23. The system, as set forth in claim 22, wherein each of the first conductive post and the second conductive post comprise different types of material.

24. The system, as set forth in claim 22, wherein the first conductive post comprises polysilicon.

25. The system, as set forth in claim 22, wherein the second conductive post comprises a metal.

26. The system, as set forth in claim 22, wherein the second conductive post comprises tungsten.

* * * * *